United States Patent [19]

Yasuda et al.

[11] Patent Number: 4,527,279
[45] Date of Patent: Jul. 2, 1985

[54] SYNCHRONIZATION CIRCUIT FOR A VITERBI DECODER

[75] Inventors: Yutaka Yasuda; Yasuo Hirata; Shuji Murakami; Katsuhiro Nakamura; Yukitsuna Furuya, all of Tokyo, Japan

[73] Assignees: Kokusai Denshin Denwa Co.; NEC Corporation, both of Tokyo, Japan

[21] Appl. No.: 511,774

[22] Filed: Jul. 6, 1983

[30] Foreign Application Priority Data

Jul. 12, 1982 [JP] Japan .................. 57-120944
Jul. 12, 1982 [JP] Japan .................. 57-120946

[51] Int. Cl.³ .............................................. H04L 7/04
[52] U.S. Cl. ................................... 375/114; 371/46
[58] Field of Search ................. 375/106, 114, 17, 37, 375/42, 67; 371/43, 46; 340/347 DD; 332/9 R, 16 R

[56] References Cited

U.S. PATENT DOCUMENTS

| 3,665,396 | 5/1972 | Forney, Jr. ............... | 371/46 |
| 3,789,359 | 1/1974 | Clark, Jr. et al. .......... | 371/46 |
| 3,872,432 | 3/1975 | Bismarck ................ | 371/46 |
| 4,346,473 | 8/1982 | Davis .................... | 375/17 |
| 4,447,908 | 5/1984 | Chevillat et al. .......... | 375/67 |
| 4,462,101 | 7/1984 | Yasuda et al. ............ | 371/43 |

Primary Examiner—Jin F. Ng
Assistant Examiner—Stephen Chin
Attorney, Agent, or Firm—Laff, Whitesel, Conte & Saret

[57] ABSTRACT

A Viterbi decoder synchronization circuit comprises a circuit that derives a word synchronization signal from a received bit stream of convolutional codes. A first detector detects a maximum of metric values derived from the Viterbi decoder at different locations in time. A memory is provided for storing therein the address codes derived at different times and the maximum metric values detected by the first detector. A second detector is connected to the memory for detecting the presence of a path between the states addressed by the address codes stored in the memory. An integrator is connected to the second detector to integrate its output signal. To the integrator is connected a third detector which detects when the integrator output reaches a value indicative of one of word-in-sync and word-out-of-sync conditions of the Viterbi decoder. A phase shift signal is generated in response to an output signal from the third detector and applied to a phase shifter to introduce a delay time to the bit stream.

5 Claims, 10 Drawing Figures

SYNCHRONIZATION CIRCUIT FOR A VITERBI DECODER

BACKGROUND OF THE INVENTION

The present invention relates to a synchronization circuit for a Viterbi decoder.

A convolution coder and decoder using the Viterbi algorithm can reduce error rates and increase the effective signal-to-noise ratio of a transmission system, and is particularly suitable for sattelite communication. The Viterbi decoder is described in detail in an article titled "The Viterbi Algorithm" on the Proceedings of the IEEE, Vol, 61, No. 3, March 1973, pages 268 to 278. The synchronization circuit for a Viterbi decoder is required not only to establish bit synchronization in which the received binary 1's and binary 0's have the same sequence of bit stream as the transmitted sequence of binary 1's and 0's, but also to establish word synchronization in which the binary 1's and 0's of the received code words are time coincident with the binary 1's and binary 0's of the transmitted code words. To establish word synchronization, it has been the usual practice to obtain a synchronization signal such as frame synchronization signals from PCM systems, for example. However, the synchronization format differs from system to system and as a result the synchronization circuit for a Viterbi decoder has been required to be custom designed to meet the particular format of the external system. If the synchronization signal is difficult to obtain from an external system, the application of a Viterbi decoder to such a system will be impossible.

SUMMARY OF THE INVENTION

It is therefore an object of the present invention to provide a synchronization circuit for a Viterbi decoder which eliminates the need for extracting synchronization signals from external sources.

A feature of the present invention is the provision of a synchronization circuit for a Viterbi decoder adapted to receive a bit stream of code words and having means for deriving a word synchronization signal from the bit stream, the Viterbi decoder having means for deriving an address code identifying each state of the decoder in the trellis diagram thereof and means for deriving a metric value identified by the address code. A synchronization circuit comprises a phase shifter in receipt of the bit stream and the word synchronization signal for introducing a delay time to the bit stream in response to a control signal applied thereto. A first detector detects a maximum of the derived metric values in each time slot. A memory is provided for storing therein the derived address codes and the detected maximum metric values. A second detector is connected to the memory for detecting the presence of a path between the states addressed by the address codes generated at different locations in time and generating therefrom an output signal. An integrator is connected to the second detector to integrate its output signal. To the output of the integrator is connected a third detector which detects when the integrator output reaches a value indicative of a word in-sync or a word out-of-sync condition of the Viterbi decoder. A phase shift signal is generated in response to an output signal from the third detector and applied to the phase shifter as the control signal.

According to a further feature of the invention, the third detecting means comprises a comparator which compares the output signal of the integrator with a predetermined value and generates a comparator output as an indication of the word-out-of-sync condition when the predetermined value is reached. Different values of phase shift are represented by a series of recyclic binary codes. A memory is provided for storing the binary code in response to the comparator output and applying the stored binary code to the phase shifter. If the word-out-of-sync condition still continues, the next binary code will be stored in the memory and applied to the phase shifter and the process continues until a word-in-sync condition is established.

According to a still further feature of the invention, the third detecting means comprises a maximum value detector for detecting when the output signal of the integrator reaches a maximum value and generating an output signal as an indication of a word-in-sync condition. Different values of phase shift signal are represented by a series of recyclic binary codes. A memory stores the binary code in the absence of the output signal of the maximum value detector and applies the stored binary code to the phase shifter until the maximum value detector generates an output signal.

BRIEF DESCRIPTION OF THE DRAWINGS

The invention will be described in further detail with reference to the accompanying drawings, in which.

DETAILED DESCRIPTION

Figure 1:
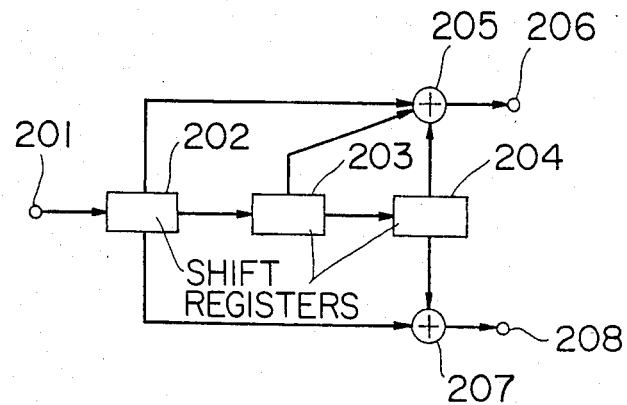
FIG. 1 is a block diagram of a known convolutional coder with which the Viterbi decoder of the invention is connected over parallel transmission channels and is presented for purposes of describing the operation of the Viterbi decoder of the present invention.
Figure 2:
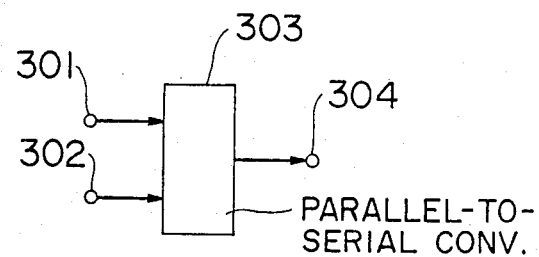
FIG. 2 is a block diagram of a parallel-to-serial converter to be used in conjunction with the convolutional coder of FIG. 1 if bit-serial transmission is desired.
Figure 3:
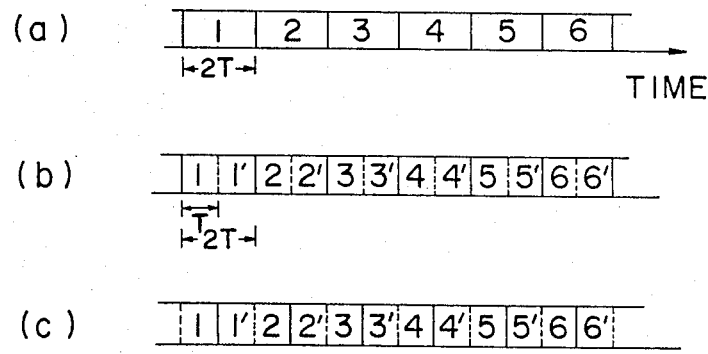
FIG. 3 is a schematic illustrations of the code formats of the transmitted and received digital signals and presented for the purpose of describing a word-in-sync and word-out-of-sync conditions.

FIG. 1 is an illustration of a convolutional coder from which the Viterbi decoder of the present invention receives a coded signal. This convolutional coder is made up of three shift registers 202, 203 and 204 connected in series to receive a code signal at intervals 2T, as shown in FIG. 3a, at terminal 201, an Exclusive-OR gate 205 having its inputs connected to the outputs of shift registers 202, 203, 204, and an Exclusive-OR gate 207 whose inputs are connected to the outputs of shift registers 202 and 204. Rate-½ convolutional code words with a constraint length 3 are generated at terminals 206 and 208 as shown in FIG. 3b. The generated code words may be transmitted in parallel form or may be coupled to input terminals 301 and 302 of a parallel-to-serial converter 303 (FIG. 2). The output terminal 304 of the converter is coupled to a modulator, not shown, to modulate the code bits upon a carrier for transmission.

For proper decoding of the convolutional code it is necessary that a Viterbi decoder must establish bit synchronization as well as word synchronization. If the received code word is in serial form and is delayed by an interval T, the Viterbi decoder would recognize the delay input as a sequence of code words (1', 2)(2', 3)(3', 4) and so on, as shown in FIG. 3c, and if in parallel form, a wrong pair of codes would be processed.

Figure 4:
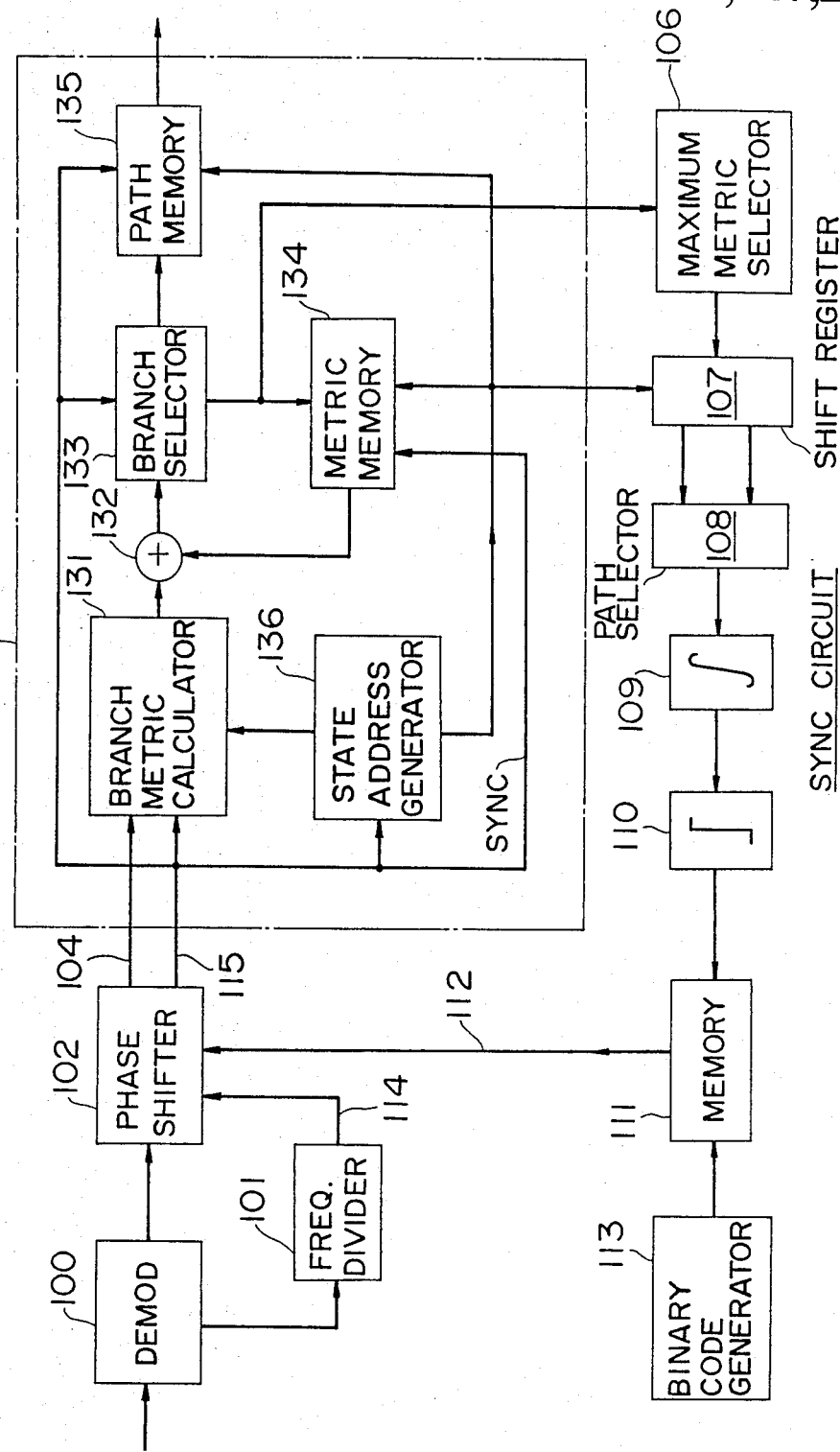
FIG. 4 is a block diagram of a first preferred embodiment of the present invention.

Referring to FIG. 4, there is shown a Viterbi decoder and a synchronization circuit constructed therefor according to a first embodiment of the present invention. The transmitted convolutional code words are demodulated by a demodulator 100 from which bit synchronization signal is derived for coupling to a ½ frequency divider 101 to provide a word synchronization signal to a word sync terminal 114. The demodulated convolutional code words are fed to a phase shifter 102. As will be described in detail later, the phase shifter 102 provides a phase-controlled sequence of bit streams to a line 104 and a word synchronization signal to a line 115.

To the phase shifter 102 is connected a known Viterbi decoder 103. The convolutional code signal from the phase shifter 102 is applied to a branch metric calculator 131 which receives the applied bit streams in response to the word sync signal to calculate the incremental value of the branch metric addressed by a "state" address generator 136 which essentially comprises a counter. A metric memory 134 receives the output of a branch selector 133 to store the metric value of each "state" in the trellis diagram of the Viterbi algorithm and reads the stored value for coupling to an adder 132 where it is summed with the incremental metric value. The metric selector 133 is also synchronized to receive the output of the adder 132 to select the greater metric value (bit count) of the two metric branches connected to each "state". The metric value of the selected branch is applied to the metric memory 134 and to a path memory 135 which is also synchronized to store the selected metric path and deliver binary 1's and 0's as the selected path proceeds in the trellis diagram.

Figure 5A:
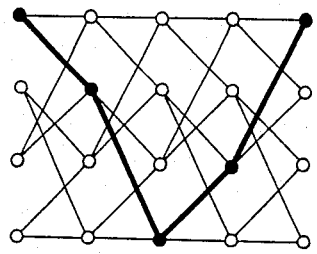
FIGS. 5a and 5b are trellis diagrams which occur during word-out-of-sync and word-in-sync conditions.
Figure 5B:
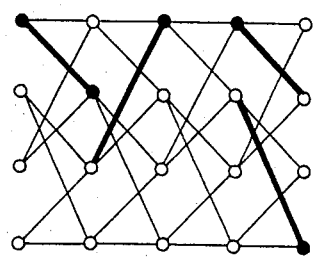

FIGS. 5a and 5b are illustrations of trellis diagrams of the Viterbi decoder in the event of word-in-sync and word-out-of-sync conditions, respectively. Black dots in the trellis diagrams indicate "states" having a maximum metric, and heavy lines indicate paths selected between maximum metrics. If the Viterbi decoder is in word-sync with the transmitted bit stream, the selected metric paths are interconnected with each other as shown in FIG. 5a and the maximum metric corresponds to a maximum value which can be taken by the branch metric. In contrast, the word-out-of-sync condition is approximately equivalent to a transmission error rate of 50%, and in most instances the maximum metric paths are not interconnected as shown in FIG. 5b. This means that the metric of the next state which is connected to the state having a non-maximum metric value will become maximum in the next time slot. Therefore, during the in-sync condition it is highly likely that there exists a path between "states" having maximum metrics, while the likelihood of the existence of such a path is less during word-out-of-sync conditions. It will therefore be seen that integrating the output of the branch selector 133 results in a low level signal indicating the presence of a word-out-of-sync condition and a high level signal indicating the presence of a word-in-sync condition.

The synchronization circuit of the invention is therefore connected to the output of the branch selector 133. The synchronization circuit comprises a maximum metric selector 106, a shift register 107, a path selector 108, a digital integrator 109, a digital threshold detector or comparator 110, a phase memory 111 and a binary code generator 113. The maximum metric selector 106 essentially comprises a memory for storing the metric of each "state" of the trellis diagram and a control unit that compares the stored metrics one against another to select a maximum value for coupling to a shift register 107. The shift register 107 is loaded with the state address codes of the selected maximum metrics and the values of the selected maximum metrics. The path selector 108 is connected to the output of shift register 107 to determine whether there is a path between maximum metric states in the past history and maximum metric states that have occurred up to the present, and feeds its output to the integrator 109. The comparator 110 compares the output of the integrator 109 with a predetermined threshold level and feeds a write-enable pulse to the phase memory 111 as an indication of a word-out-of-sync condition when the integrator output drops to the threshold level. The phase memory 111 is enabled to write phase shifting information from the binary code generator 113 which generates a series of recyclic binary codes representing different amounts of phase shift.

In response to the write-enable pulse the memory 111 is updated with a phase shift binary code generated by the binary code generator 113 which has been incremented by one and applies the stored binary code through a line 112 to the phase shifter 102. The phase shifter 102 introduces a one-bit delay time to the bit stream of the convolutional code words on line 104. If the Viterbi decoder is out of sync by a one-bit interval, a word in-sync condition will be quickly established in response to the write-enable pulse. If the decoder is out of sync by a two-bit interval, the word-out-of-sync condition still exists and the binary code generator 113 will be further incremented by one and the memory 111 is updated with the incremented binary code to introduce a two-bit interval. Once the system enters a word-in-sync condition, the comparator 110 generates a write-disable signal to the memory 111 to operate the Viterbi decoder with the most recent phase shift value.

Figure 6:
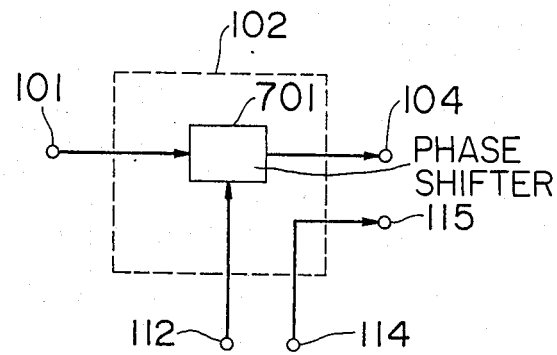
FIGS. 6 and 7 are block diagrams of the phase shifter of FIG. 4.
Figure 7:
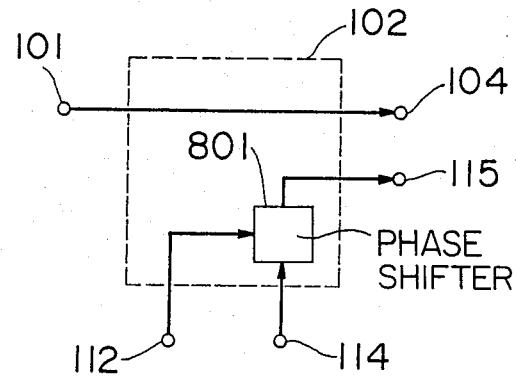

FIGS. 6 and 7 are illustrations of examples of the phase shifter 102. In FIG. 6, the phase shifter comprises a digial delay circuit 701 which introduces an incremental delay time in response to the binary code supplied on line 112 from the memory 111 and the word sync signal on line 114 is applied direct to the word sync terminal 115 of the Viterbi decoder 103. In FIG. 7, the convolutional code words on terminal 101 are applied direct to the terminal 104 of the Viterbi decoder 103. A digital delay circuit 801 is arranged to delay the word synchronization signal on terminal 114 in response to the binary code on terminal 112 and supplies the delayed word sync to the terminal 115.

Figure 8:
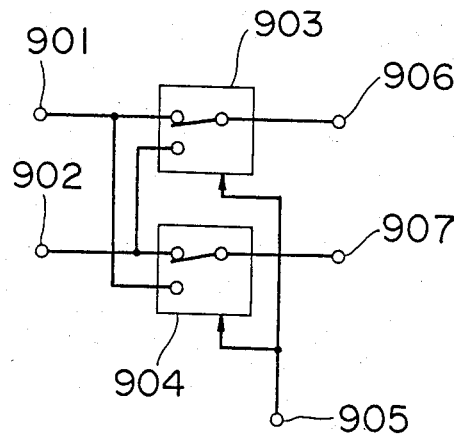
FIG. 8 is a circuit diagram of a phase shifter which is used when the convolutional code is transmitted in parallel form.

FIG. 8 is an illustration of a phase shifter 102 in the case of parallel transmission in which the output terminals 206 and 208 of the convolutional coder are coupled by separate channels to the demodulator 100. The phase shifter 102 for the parallel transmission comprises a pair of terminals 901 and 902 which are coupled to the terminals 206 and 208 respectively and a pair of switches 903 and 904 which are arranged to reverse their connections from the input terminals 901 and 902 to output terminals 906 and 907 in response to a switching signal applied to a terminal 905.

Figure 9:
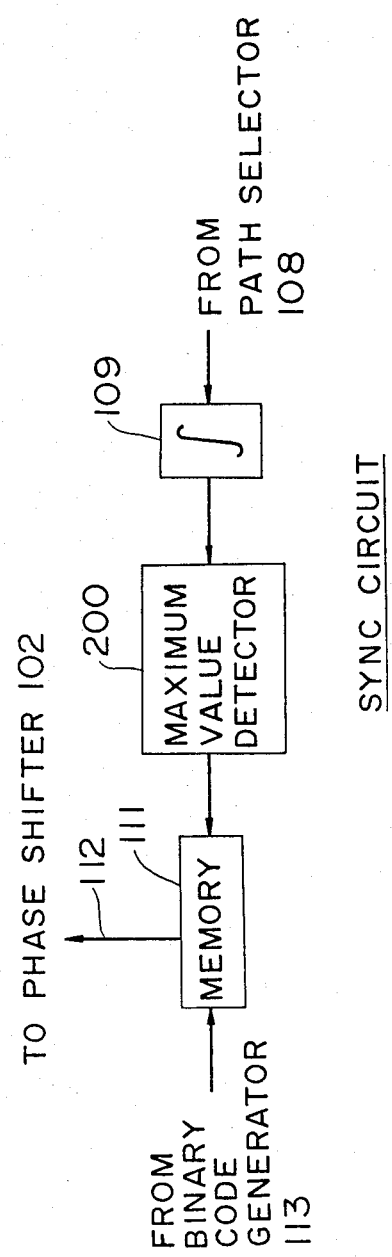
FIG. 9 is a block diagram of a second preferred embodiment of the present invention.

FIG. 9 is an illustration of a second embodiment of the synchronization circuit which is generally similar to that shown in FIG. 4 with the exception that a maximum value detector 200 is used instead of the comparator 110. Since the metric path is maximum during word in-sync conditions, the maximum value detector 200 will provide a high level, write-disable signal during word in-sync conditions. During word out-of-sync conditions, the maximum value detector 200 provides a low-level, write-enable signal to the memory 111 to cause it to be updated with the most recent value of the incremental binary code supplied from the binary code generator 113 and apply the stored binary code to the phase shifter 102. This updating continues as long as the word out-of-sync condition exists and the Viterbi decoder seeks word synchronization. Once the Viterbi decoder is word synchronized, the difference between the maximum and minimum metrics increases, resulting in a maximum value to appear at the output of the integrator 109. The maximum value detector 200 provides a write-disable signal to the memory 111 to cause it to retain the most recent phase shift value to keep the Viterbi decoder in synchronism.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A synchronization circuit for a viterbi decoder adapted to receive a bit stream of code words and having means for deriving a word synchronization signal from said bit stream, said Viterbi decoder having means for deriving from said bit stream an address code identifying each state of the decoder in a trellis diagram and means for deriving a metric value from said address code, said synchronizing circuit comprising:

a phase shifter responsive to said bit stream and to said word synchronization signal for introducing a delay time to one of said bit stream and said word synchronization signal in response to a control signal applied thereto;

first detecting means for detecting a maximum of said derived metric values;

a memory for storing therein said derived address codes and said detected maximum metric values;

second detecting means connected to said memory for detecting the presence of a path between the states addressed by the address codes generated at different locations in time and generating therefrom an output signal;

integrating means for integrating the output signal of said second detecting means;

third detecting means for detecting when an output signal of said integrating means reaches a value indicative of either a word-in-sync or a word-out-of-sync condition of said Viterbi decoder; and means for generating a phase shift signal in response to an output signal from said third detecting means and for applying said phase shift signal to said phase shifter as said control signal.

2. A synchronization circuit as claimed in claim 1, wherein said third detecting means comprises a comparator for comparing the output signal of said integrating means with a predetermined value and generating a comparator output signal as an indication of the word-out-of-sync condition when the predetermined value is reached.

3. A synchronization circuit as claimed in claim 2, wherein said phase shift signal generating means comprises binary code generating means for generating a series of recyclic binary codes representing different values of phase shift and memory means for storing a said binary code in response to said comparator output signal and applying the stored binary code to said phase shifter as said control signal.

4. A synchronization circuit as claimed in claim 1, wherein said third detecting means comprises maximum value detecting means for detecting when the output signal of said integrating means reaches a maximum value and generating an output signal as an indication of said word-in-sync condition.

5. A synchronization circuit as claimed in claim 4, wherein said phase shift signal generating means comprises binary code generating means for generating a series of recyclic binary codes representing different values of phase shift and memory means for storing a said binary code in the absence of the output signal of said maximum value detecting means and applying the stored binary code to said phase shifter as said control signal until the time of occurrence of the output signal of said maximum value detecting means.

* * * * *